(12) United States Patent
Mueller et al.

(10) Patent No.: US 12,455,313 B2
(45) Date of Patent: Oct. 28, 2025

(54) METHOD FOR TESTING A PACKAGING SUBSTRATE, AND APPARATUS FOR TESTING A PACKAGING SUBSTRATE

(71) Applicant: Applied Materials, Inc., Santa Clara, CA (US)

(72) Inventors: Bernhard G. Mueller, Finsing (DE); Axel Wenzel, Augsburg (DE); Nikolai Knaub, Munich (DE); Georg Jost, Munich (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/856,722

(22) PCT Filed: Apr. 28, 2022

(86) PCT No.: PCT/EP2022/061388
§ 371 (c)(1),
(2) Date: Oct. 14, 2024

(87) PCT Pub. No.: WO2023/208350
PCT Pub. Date: Nov. 2, 2023

(65) Prior Publication Data
US 2025/0251446 A1   Aug. 7, 2025

(51) Int. Cl.
*G01R 31/305* (2006.01)
*G01R 31/28* (2006.01)
*H01L 21/66* (2006.01)

(52) U.S. Cl.
CPC ....... *G01R 31/305* (2013.01); *G01R 31/2896* (2013.01); *H01L 22/12* (2013.01)

(58) Field of Classification Search
None
See application file for complete search history.

(56) References Cited

U.S. PATENT DOCUMENTS

| 4,443,278 A | 4/1984 | Zingher |
| 4,733,174 A * | 3/1988 | Crosby ............... G01R 31/306 |
| | | 324/73.1 |

(Continued)

FOREIGN PATENT DOCUMENTS

| JP | 45008820 B | 3/1970 |
| JP | S57196539 A | 12/1982 |

(Continued)

OTHER PUBLICATIONS

Taiwan Office Action dated Mar. 5, 2024 for Application No. 112114705 (44020774TW01).

(Continued)

*Primary Examiner* — Eman A Alkafawi
*Assistant Examiner* — Suresh K Rajaputra
(74) *Attorney, Agent, or Firm* — Patterson + Sheridan, LLP

(57) ABSTRACT

A method for testing a packaging substrate with at least one electron beam column is described, wherein the packaging substrate is a panel level packaging substrate or an advanced packaging substrate. The method includes placing the packaging substrate on a stage in a vacuum chamber; directing at least one electron beam of the at least one electron beam column on at least a first portion of the packaging substrate; directing the at least one electron beam of the at least one electron beam column on at least a second portion of the packaging substrate; detecting signal electrons emitted upon impingement of the at least one electron beam for testing a first device-to-device electrical interconnect path of the packaging substrate; and illuminating at least a third portion of the packaging substrate with UV radiation.

20 Claims, 4 Drawing Sheets

(56) References Cited

U.S. PATENT DOCUMENTS

2015/0198648 A1 7/2015 Shoham et al.
2020/0355621 A1 11/2020 Chuang et al.

FOREIGN PATENT DOCUMENTS

| JP | H1119668 A | 1/1999 |
| JP | 2000036273 A | 2/2000 |
| JP | 2009004114 A | 1/2009 |
| JP | 2025512325 A | 4/2025 |
| TW | 201704766 A | 2/2017 |

OTHER PUBLICATIONS

International Search Report and Written Opinion for International Application No. PCT/EP2022/061388 dated Dec. 20, 2022.
Brunner, et al., Electron-Beam MCM Testing and Probing, IEEE Transactions on Components, Packaging and Manufacturing Technology. Part B: Advanced Packaging, IEEE Service Center, Piscataway, NJ, US, vol. 17, No. 1, Feb. 1, 1994, pp. 62-68.
Polyakov, et al., Optical and Electrical Properties of AlCrN Films Grown by Molecular Beam Epitaxy, Journal of Vacuum Science and Technology: Part B, AVS/AIP, Melville, New York, NY, US, vol. 22, No. 6, Nov. 15, 2004, pp. 2758-2763.
Brunner, et al., Contactless Testing of Multi-chip Modules, Microelectronic Engineering, Elsevier Publishers BV., Amsterdam, NL, vol. 24, No. 1-4, Mar. 1, 1994, pp. 61-70.
Lukianoff, et al., Electron Beam Induced Voltage and Injected Charge Modes of Testing, Scanning, vol. 5, No. 2, Jan. 1, 1983, pp. 53-70.
Korean Office Action dated May 26, 2025 for Application No. 10-2024-7039063.
Japanese Office Action dated Jun. 26, 2025 for Application No. 2024-563569, 15 pages.
Tokoro, et al., "Technical Note (Surface Observation Method by Scanning Electron Microscopy", Japan Society of Applied Physics, 1981, 6 pages.

\* cited by examiner

METHOD FOR TESTING A PACKAGING SUBSTRATE, AND APPARATUS FOR TESTING A PACKAGING SUBSTRATE

FIELD

The present disclosure relates to a method and an apparatus for testing a packaging substrate. More particularly, embodiments described herein relate to the contactless testing of electric interconnections in a packaging substrate, i.e. a panel-leveling packaging (PLP) substrate or an advanced packaging (AP) substrate by using electron beams, particularly for identifying and characterizing defects such as shorts, opens, and/or leakages.

BACKGROUND

In many applications, it is necessary to inspect a substrate to monitor the quality of the substrate. Since defects may e.g. occur during the processing of the substrates, e.g. during structuring or coating of the substrates, an inspection of the substrate for reviewing the defects and for monitoring the quality may be beneficial.

Semiconductor packaging substrates and printed circuits boards for the manufacture of complex microelectronic and/or micro-mechanic components are typically tested during and/or after manufacturing for determining defects, such as shorts or opens, in metal paths and interconnects provided at the substrate. For example, substrates for the manufacture of complex microelectronic devices may include a plurality of interconnect paths for connecting semiconductor chips or other electrical devices that are to be mounted on the packaging substrate.

Various methods for testing such components are known. For example, contact pads of a component to be tested may be contacted with a contact probe, in order to determine whether the component is defective or not. Since the components and the contact pads are becoming smaller and smaller due to the progressing miniaturization of components, contacting the contact pads with a contact probe may be difficult, and there may even be a risk that the device under test gets damaged during the testing.

The complexity of packaging substrates is increasing and design rules (feature size) are decreasing substantially. Within such substrates the surface contact points (for later flip chip or other chip mounting) are connected to other surface contact points on the packaging substrate to interconnect semiconductor (or other) devices. Standard methods like electrical-mechanical probing for electrical test cannot satisfy the requirements of volume production testing as the throughput decreases (higher number of test points) and contacting reliability decreases (smaller contact size). Beyond the reduced size and the problem of potentially damaging contact pads, the topography of the packaging substrates results in difficulties for other test methods, like test methods utilizing capacitive detectors or electrical field detectors, because such methods beneficially have a small mechanical spacing.

Accordingly, it would be beneficial to provide testing methods and testing apparatuses that are suitable for reliably and quickly testing complex microelectronic devices, particularly packaging substrates such as AP substrates and PLP substrates.

SUMMARY

In light of the above, a method and apparatuses for testing a packaging substrate are provided according to the independent claims. Further aspects, advantages, and beneficial features are apparent from the dependent claims, the description, and the accompanying drawings.

According to an embodiment, a method for testing a packaging substrate with at least one electron beam column is provided. The packaging substrate is a panel level packaging substrate or an advanced packaging substrate. The method includes placing the packaging substrate on a stage in a vacuum chamber; directing at least one electron beam of the at least one electron beam column on at least a first portion of the packaging substrate; directing the at least one electron beam of the at least one electron beam column on at least a second portion of the packaging substrate; detecting signal electrons emitted upon impingement of the at least one electron beam for testing a first device-to-device electrical interconnect path of the packaging substrate; and illuminating at least a third portion of the packaging substrate with UV radiation.

According to an embodiment, an apparatus for testing a packaging substrate in accordance with the methods described herein is provided.

According to an embodiment, an apparatus for contactless testing of a packaging substrate is provided. The apparatus includes a vacuum chamber; a stage within the vacuum chamber, the stage being configured to support the packaging substrate being a panel level packaging substrate or an advanced packaging substrate; a charged particle beam column configured to generate an electron beam, the charged particle beam column comprising: an objective lens configured to focus the electron beam on the packaging substrate; a scanner configured to scan the electron beam to different positions on the packaging substrate; and an electron detector for detecting signal electrons emitted upon impingement of the electron beam on the packaging substrate; the apparatus further comprising: a UV source assembly configured to illuminate the packaging substrate in the vacuum chamber with one or more pulses of UV radiation; and an analysis unit for determining, based on the signal electrons, if a first device-to-device electrical interconnect path is defective.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus and a method for manufacturing the apparatuses and devices described herein. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION

Figure 1:
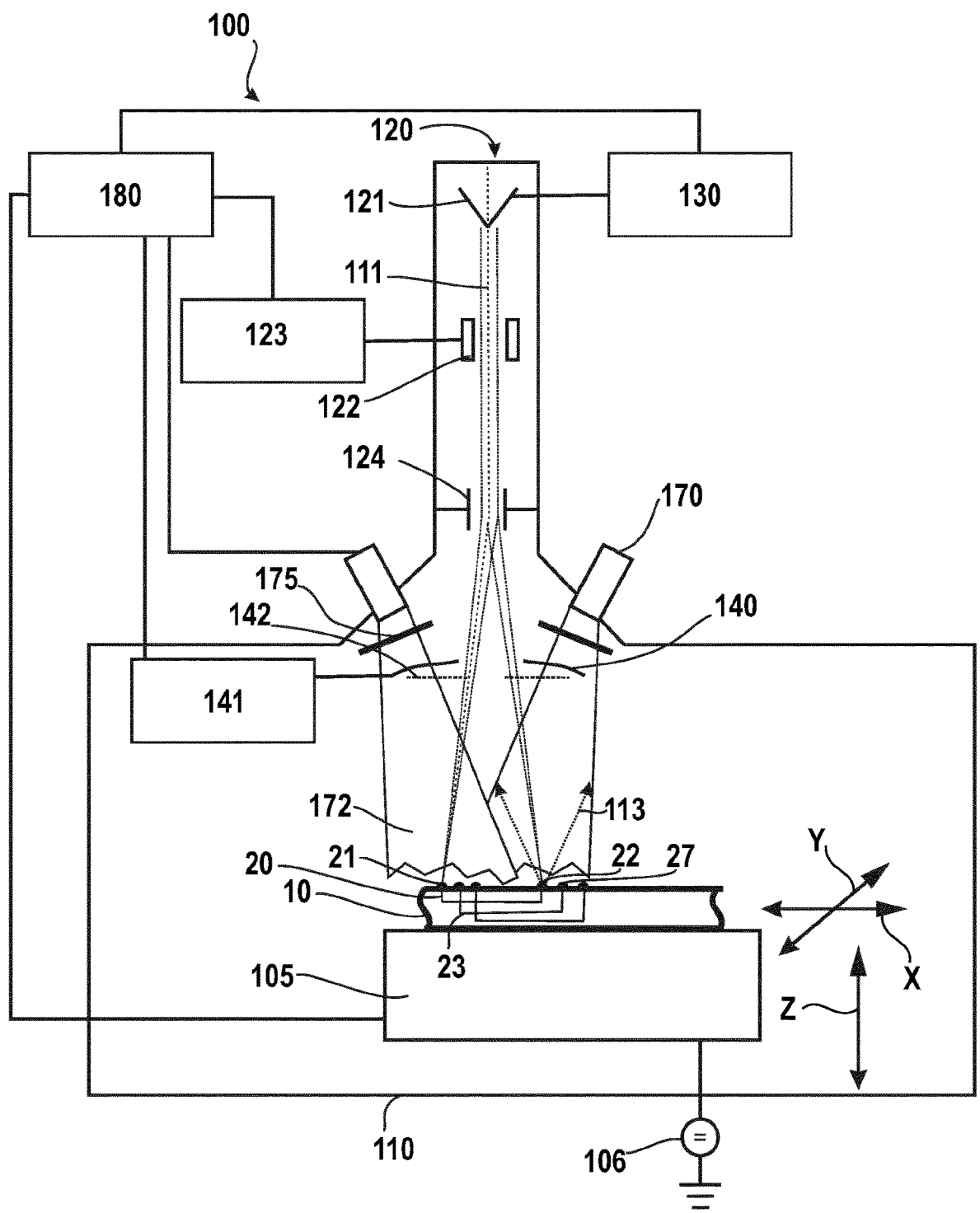
FIG. 1 shows a schematic sectional view of an apparatus for testing a packaging substrate in accordance with any of the testing methods described herein.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. The intention is that the present disclosure includes such modifications and variations.

Within the following description of the drawings, the same reference numbers refer to same components. Only the differences with respect to the individual embodiments are described. The structures shown in the drawings are not necessarily depicted true to scale but rather serve the better understanding of the embodiments.

Embodiments of the present disclosure relate to testing and/or defect review for packaging substrates, i.e. panel-leveling packaging (PLP) substrates or advanced packaging (AP) substrates, according to methods as described herein. At least one electron beam is used for writing and reading charges on the packaging substrate, particularly for identifying and characterizing defects such as shorts, opens, and/or leakages. According to some embodiments, which can be combined with other embodiments described herein, the voltage contrasts on the packaging substrate may be determined by detection of signal electrons. In order to further improve the voltage contrast in the methods according to embodiments of the present disclosure and the apparatuses according to embodiments of the present disclosure charge control is provided. The packaging substrate can be discharged to defined conditions.

According to an embodiment, a method for testing a packaging substrate is provided. The packaging substrate is a panel level packaging substrate or an advanced packaging substrate. The method being conducted with at least one electron beam column includes placing the packaging substrate on a stage in a vacuum chamber. The method further includes directing at least one electron beam of the at least one electron beam column on at least a first portion of the packaging substrate and directing the at least one electron beam of the at least one electron beam column on at least a second portion of the packaging substrate. Signal electrons emitted upon impingement of the at least one electron beam are detected for testing a first device-to-device electrical interconnect path of the packaging substrate. At least a third portion of the packaging substrate is irradiated with UV radiation. For example, the at least third portion can include the first portion and the second portion. Particularly, the at least third portion can be or can include the packaging substrate. The first portion and the second portion may overlap. However, according to some embodiments, which can be combined with other embodiments described herein, the first portion can be one or more first surface contact points on which the charge is written. The second portion can be one or more second surface contact points on which the charge is read.

According to some embodiments, which can be combined with other embodiments described herein, the at least one electron beam is directed on the at least first portion with a first landing energy and on the at least second portion with a second landing energy different than the first charging landing energy. For example, the signal electrons can be detected upon impingement of the at least one electron beam with the second energy for reading of a charge on the packaging substrate.

The complexity of packaging substrates has been increasing for years, with the aim of reducing the space requirements of semiconductor packages. For reducing the manufacturing costs, packaging techniques were proposed, such as 2.5D ICs, 3D-ICs, and wafer-level packaging (WLP), e.g. fan-out WLP. In WLP techniques, the integrated circuit is packaged before dicing. A "packaging substrate" as used herein relates to a packaging substrate configured for an advanced packaging technique, particularly an WLP-technique or a panel-level-packaging (PLP)-technique.

"2.5D integrated circuits" (2.5D ICs) and "3D integrated circuits" (3D ICs) combine multiple dies in a single integrated package. Here, two or more dies are placed on a packaging substrate, e.g. on a silicon interposer or a panel-level-packaging substrate. In 2.5D ICs, the dies are placed on the packaging substrate side-by-side, whereas in 3D ICs at least some of the dies are placed on top of each other. The assembly can be packaged as a single component, which reduced costs and size as compared to a conventional 2D circuit board assembly.

A packaging substrate typically includes a plurality of device-to-device electrical interconnect paths for providing electrical connections between the chips or dies that are to be placed on the packaging substrate. The device-to-device electrical interconnect paths may extend through a body of the packaging substrate in a complex connection network, vertically (perpendicular to the surface of the packaging substrate) and/or horizontally (parallel to the surface of the packaging substrate) with end points (referred to herein as surface contact points) exposed at the surface of the packaging substrate.

An advanced packaging (AP) substrate provides the device-to-device electrical interconnection paths on or within a wafer, such as a silicon wafer. For example, an AP substrate may include Through Silicon Vias (TSVs), e.g., provided in a silicon interposer, other conductor lines extending through the AP substrate. A panel-level-packaging substrate is provided from a compound material, for example material of a printed circuit board (PCB) or another compound material, including, for example ceramics and glass materials.

Panel-level-packaging substrates are manufactured that are configured for the integration of a plurality devices (e.g., chips/dies that may be heterogeneous, e.g. may have different sizes and configurations) in a single integrated package. Further, AP substrates may be combined on a PLP substrate. A panel-level-packaging substrate typically provides sites for a plurality of chips, dies, or AP substrates to be placed on a surface thereof, e.g. on one side thereof or on both sides thereof, as well as a plurality of device-to-device electrical interconnect paths extending through a body of the PLP substrate.

Notably, the size of a panel-level-substrate is not limited to the size of a wafer. For example, a panel-level-substrate may be rectangular or have another shape. Specifically, a panel-level-substrate may provide a surface area larger than the surface area of a typical wafer, e.g., 1000 cm² or more. For example, the panel-level-packaging substrate may have a size of 30 cm×30 cm or larger, 60 cm×30 cm or larger, 60 cm×60 cm or larger.

According to embodiments of the present disclosure, E-beam testing and/or E-beam review provides for testing of contact pads of 60 µm or below or even about 10 µm or below. Voltage contrast testing imaging can be provided. Testing can be provided at or between "surface contact points" of the packaging substrate.

A "surface contact point" may be understood as an end point of an electrical interconnect path that is exposed at a surface of the packaging substrate, such that an electron beam can be directed on the surface contact point for contactless charging or probing the electrical interconnect path. A surface contact point is configured to electrically contact a chip, a die, a smaller package, or other electrical components like capacitors, resistors, coils, or the like, that is to be placed on the surface of the packaging substrate, e.g. via soldering. Electrical components may also include active electrical components, such as transformer changing the voltage in a region of the package. In some embodiments, the surface contact points may be or may include solder bumps.

According to embodiments of the present disclosure, 100% of the electrical interconnect paths are tested. The costs of ownership of device packages including the chips etc., such as processors, memories, or the like (microelectronic devices), is mainly determined by the highly integrated microelectronic devices. Accordingly, mounting a non-defective microelectronic device to a defective packaging substrate is disadvantageous with respect to manufacturing cost. A fully non-defective packaging substrate is desirable before mounting of the microelectronic devices.

The present disclosure relates to methods and apparatuses for testing packaging substrates that are configured for the integration of a plurality of devices in one integrated package, and that include at least one device-to-device electrical interconnect path. According to embodiments of the present disclosure, a test system, test apparatus, or test method may detect and/or classify defective electrical connections in a packaging substrate, such as opens, shorts, leakage defects, or others. Particularly, the test methods and test systems may provide a contactless testing. A contact pad pitch of 60 µm or below or even about 10 µm or below is difficult and even impossible for mechanical probing. Also, the small contact pads must not be damaged by any scratch. Contactless testing is beneficial.

According to some embodiments, which can be combined with other embodiments described herein, charge control during writing of a charge can be provided by operating the electron beam column with a defined landing energy. Particularly, the landing energy, i.e. the energy of the electron beam upon impingement of the packaging substrate, can be varied to control the charge provided on the packaging substrate. By variation of the landing energy, an area of impingement of the electron beam can be charged positively, negatively, or not charged. During a writing operation, no charge is beneficially provided to the packaging substrate. A contactless electrical test can be provided with an e-beam, wherein the charge can be applied at, for example, a first surface contact point, and charge can be read at, for example, a second surface contact point. This enables the detection and classification of electrical defects of the packaging substrate. The different e-beam landing energies (Upe) control the SE yield (secondary electron yield) and, thus, the total electron yield. To achieve voltage contrast signal on several substrates and/or after repeated e-beam scans and test sequences with a good repeatability, it is beneficial to discharge the test substrate to a defined condition, for example, the starting condition in regards of potential and charge distribution.

According to some embodiments, which can be combined with other embodiments described herein, a method for testing of packaging substrate includes placing the packaging substrate on a stage in a vacuum chamber; directing an electron-beam of the at least one electron beam column with the first landing energy on at least a first portion of the packaging substrate and directing the electron-beam of the at least one electron beam column with a second landing energy different than the first landing energy on the packaging substrate. The method further includes detecting signal electrons emitted upon impingement of the electron-beam for testing at least the first device-to-device electrical interconnect path of the packaging substrate. According to embodiments of the present disclosure, illuminating at least a third portion of the packaging substrate with UV radiation provides discharging of the at least one portion. A defined potential and/or charge distribution can be provided. This may be repeated one or more times during testing of a packaging substrate. Particularly, the discharging by UV radiation may be provided a plurality of times in a test sequence of testing a packaging substrate.

Testing of features, for example, electrical interconnection path, of the packaging substrate can be provided, wherein charge up of features and/or the packaging substrate can be controlled. Variation of the e-beam primary energy ($U_{pe}$), i.e. the landing energy of the electron beam on the packaging substrate can be utilized control the charge on the packaging substrate or respective portions thereof. UV radiation is utilized to discharge the packaging substrate, i.e. to remove the previously provided charge or charge that has been accumulated on the packaging substrate before the test procedure. Accordingly, an improved contactless electrical test with an electron-beam can be provided. The test may include a voltage signal reading, i.e. a voltage contrast measurement upon detection of signal electrons, for example, secondary electrons. Test positions, i.e. surface contact points, of an advanced packaging substrate or panel level packaging substrate can be charged without contact to avoid damage to the surface contact points. Charge can be removed by the photo effect generated with the UV radiation.

FIG. 1 shows an apparatus 100 for testing a packaging substrate 10 according to embodiments described herein in a schematic sectional view. The apparatus 100 includes a vacuum chamber 110 that may be a testing chamber specifically configured for testing or that may be one vacuum chamber of a larger vacuum system, e.g. a processing chamber of a packaging substrate manufacturing or processing system.

As it is schematically depicted in FIG. 1, a packaging substrate 10 includes a first device-to-device electrical interconnect path 20 extending between a first surface contact point 21 and a second surface contact point 22 of the packaging substrate 10. Optionally, the first device-to-device electrical interconnect path 20 may extend between three or more surface contact points that may be provided on the same surface or on two opposite surfaces of the packaging substrate. The device-to-device electrical interconnect path 20 depicted in FIG. 1 extends only between the first surface contact point 21 and the second surface contact point 22 that are both arranged at a top surface of the packaging substrate, but the present disclosure is not limited to such device-to-device electrical interconnect paths, and the device-to-device electrical interconnect path may be a complex network of vias, pillars, and/or conductor lines extending through the packaging substrate and having a plurality of surface contact points.

The packaging substrate 10 may include a plurality of device-to-device electrical interconnect paths 20 for connecting a plurality of devices that are to be placed on the packaging substrate 10. In FIG. 1, three device-to-device electrical interconnect paths are exemplarily depicted, but the packaging substrate 10 may include thousands or ten-thousands of such device-to-device electrical interconnect paths that are typically electrically isolated from each other, if no short exists between two electrical interconnect paths.

According to embodiments described herein, the packaging substrate 10 is placed on a stage 105 in the vacuum chamber 110. The stage can be movable, particularly in the z-direction (i.e., in a direction perpendicular to the stage surface) and/or in the x- and y-directions (i.e., in the plane of the stage surface). The stage 105 is provided within the vacuum chamber and is configured to support the packaging substrate being one of a panel level packaging substrate and an advanced packaging substrate. An electron beam 111 is directed on the first surface contact point 21. The electron beam 112 can be scanned to be directed to that second surface contact point 22. Signal electrons 113 emitted from the second surface contact point 22 are detected for testing the first device-to-device electrical interconnect path 20. The signal electrons may be secondary electrons and/or backscattered electrons. For example, it can be determined whether the first device-to-device electrical interconnect path 20 has an "open"-defect.

Alternatively or additionally, the electron beam 111 is directed on a further surface contact point 27 that is not an end point of the first device-to-device electrical interconnect path 20, i.e. that belongs to a second device-to-device electrical interconnect path 23 that may extend through the packaging substrate adjacent to the first device-to-device electrical interconnect path 20. Signal electrons emitted from the further surface contact point 27 are detected for testing the first device-to-device electrical interconnect path 20. The signal electrons may be secondary electrons and/or backscattered electrons. For example, it can be determined whether the first device-to-device electrical interconnect path 20 has a "short"-defect.

In particular, by detecting the signal electrons 113 emitted upon impingement of the electron beam 111 on the packaging substrate (particularly, by determining the energy of the signal electrons 113 that depends on the electric potential of the second surface contact point 22 or of the further surface contact point 27), it can be determined in a "voltage contrast measurement", if the first device-to-device electrical interconnect path 20 is defective. Specifically, defective connections in the packaging substrate can be determined and classified, e.g. in open, short and/or leakage defects.

In some embodiments, which can be combined with other embodiments described herein, one or more electrical connections extending between surface contacts on different sides of the substrate are inspected. In yet further embodiments, a first plurality of electrical connections extending between surface contacts on a first side of the substrate, a second plurality of electrical connections extending between surface contacts on a second side of the substrate, and/or a third plurality of electrical connections extending between surface contacts on different sides of the substrate are inspected. For example, one or more electron beam columns may be arranged on both sides of the substrates (not shown in the figures), such that surface contacts on both sides of the substrate can be charged and/or discharged for inspecting and testing the respective electrical connections.

According to embodiments described herein, both the charging and the probing is provided with an electron beam, particularly a scanning electron beam. Other testing methods like electrical and/or mechanical probing cannot provide the throughput provided by the methods and systems described herein. The methods and system described herein rely on the contactless charging and probing with electron beams. Further, the contact reliability of an electrical and/or mechanical tester decreases with the decreasing size and the increasing density and number of surface contact points that are to be tested in advanced packaging substrates. For example, contact pad sizes of 30 µm or less are difficult for mechanical probing. Further, the topography of the packaging substrates and of the surface contact points of packaging substrates may pose a problem for other test methods, such as for capacitive detectors or electrical field detectors. It is further advantageous to have a charging electron beam, e.g. as compared to a flood gun electron charging. In light of the complexity of the packaging substrates, the capability of local charging as compared to charging an entire area with a flood gun improves the test procedures that are available. Further, local charging reduces the overall charge accumulated on the packaging substrate. Yet further, different charging in different areas may result in a reduced overall charge provided on the substrate. For example, the overall charged can be kept close to neutral if one area is charged positive and another area is charged negative. According to some embodiments, which can be combined with other embodiments described herein, a pattern of different charges can be provided on portions of the packaging substrate. According to embodiments of the present disclosure, charge can be removed. For example, by having a lateral distribution, wherein the intensity of UV radiation or the duration of UV radiation pulse or pulses are locally adapted, discharging of local areas can be provided.

The testing method described herein is suitable for testing packaging substrates for multi-device in-package integration, particularly for testing panel-level-packaging substrates (PLP substrates) or advanced packaging substrates (AP substrates), and uses an e-beam both for charging the device-to-device electrical interconnect path 20 and for reading the charged circuitry voltage, particularly by probing the second surface contact point and/or further surface contact points. In other words, both the "electrical driving" and the "probing" is done with an electron beam, such that defects can be reliably and quickly found. Testing by e-beam charging and e-beam probing (e.g., with an EBT column or an EBR column) is independent of topography, fast, and flexible in regards of contact point positions, size and geometry, whereas the topography of the packaging substrate may be a problem for other test methods like capacitive or electrical field detectors.

A packaging substrate, such as a PLP substrate, may include a plurality of device-to-device connections, e.g. 5,000 or more, 10,000 or more, 20,000 or more, or even 50,000 or more. The connections may include Through Silicon Vias (TSVs), e.g., provided in a silicon interposer, other conductor lines extending through the packaging substrate, and/or may include multi-die interconnect bridges that may be embedded in the packaging substrate. The packaging substrate may be a multi-layer substrate including electrical interconnections in a plurality of layers arranged on top of each other, e.g. in a layer stack.

In some embodiments, the packaging substrate 10 includes a plurality of device-to-device electrical interconnect paths extending between respective first and second surface contact points, and optional further contact points, and the method may include testing the plurality of device-to-device electrical interconnect paths sequentially or in parallel. "Sequential testing" as used herein refers to the subsequent testing of a plurality of device-to-device electrical interconnect paths of the packaging substrate. For example, 5,000 or more device-to-device electrical interconnect paths are tested one after the other. "Parallel testing" as used herein may refer to the synchronous testing of two or more device-to-device electrical interconnect paths. "Parallel testing" as used herein may also refer to the testing of several device-to-device electrical interconnect paths by scanning the electron beam for charging within one field of view over several first surface contact points while scanning the electron beam for probing in one field of view over several corresponding second surface contact points.

In some embodiments, directing the electron beam 111 on the first surface contact point includes focusing the electron beam 111 on the first surface contact point 21, e.g. with a beam probe diameter on the packaging substrate of 30 μm or less, particularly 10 μm or less. A focusing of the charging electron beam on the packaging substrate, e.g. with an objective lens, can prevent the charging of substrate surface areas different from the surface contact points and can provide more accurate testing results. Additionally or alternatively, particularly for detection of signal electron beams, the electron beam may be scanned across a portion of the packaging substrate to generate an image of a portion of the packaging substrate. The image can include voltage contrast information. A defect detection of one or more electrical interconnect paths or a classification of the defect can be provided, for example, by pattern recognition within the image.

While conventional PCBs typically include comparatively large flat metal pads that form surface contact points for testing, a packaging substrate that is tested according to embodiments described herein may include huge numbers of small, convexly shaped solder bumps to be tested which makes testing more challenging. In particular, the first surface contact point 21 and the second surface contact point 22 may have a maximum dimension of 25 μm or less, particularly 10 μm or less, respectively. For example, the first and second surface contact points may be essentially round, particularly semi-spherically shaped, with a diameter of 25 μm or less, particularly 10 μm or less. According to some embodiments, which can be combined with other embodiments described herein, a surface contact point can have a three-dimensional topography, particularly a substantially semi-spherical shape.

In contrast to mechanical testers, electron beams can be accurately directed on such small surface areas because electron beams can be focused down to very small probe diameters and can be accurately directed on predetermined points of the substrate, e.g. with scan deflectors, e.g. with an accuracy in a sub-μm-range. While other testers may slip or slide from surface contact points with a convex geometry, electron beams can be accurately focused onto arbitrary geometries, such that the testing methods described herein are geometry-independent and topography-independent.

As it is schematically depicted in FIG. 1, the charged particle beam column 120 may be provided on a first side of the stage 105. In some embodiments, which can be combined with other embodiments described herein, the charged particle beam column 120 may have an electron source 121 for generating an electron beam as well as beam-optical elements, such as a scan deflector 122 and/or an objective lens 124, for directing the first electron beam onto a substrate placed on the stage 105. The objective lens 124 may be an electrostatic objective lens (as shown in FIG. 1), a magnetic objective lens, or a magnetic-electrostatic objective lens.

The apparatus 100 further includes an electron detector 140 for detecting signal electrons 113 emitted upon impingement of the second electron beam on the packaging substrate, and an analysis unit 141 configured to determine, based on the signal electrons 113, if the first device-to-device electrical interconnect path 20 is defective. In some embodiments, the analysis unit 141 may be configured to determine, based on the detected signal electrons, whether an electrical interconnect path has a defect, such as a short, an open and/or a leakage. Optionally, the analysis unit 141 may be configured to classify any detected defect. In some embodiments, the analysis unit 141 may be configured to determine, based on the detected signal electrons from subsequent measurements, whether a short or a leakage exists between two or more electrical interconnect paths. In some implementations, the signal electrons 113 detected by the electron detector 140 may provide information about an electric potential of the substrate location from which the signal electrons 113 are emitted or reflected, and the analysis unit 141 may be configured to determine from said information if the first device-to-device electrical interconnect path 20 is defective or not. The analysis unit 141 may be further configured to classify a determined defect. Specifically, testing may include determining, by the analysis unit 141, if the first device-to-device electrical interconnect path 20 has any of a short, an open, and/or a leakage. An "open" is understood as an open electrical interconnect path that does not actually electrically connect the first surface contact point 21 and the second surface contact point 22. A "short" is understood as an electrical connection between two electrical interconnect paths that are actually to be electrically separated.

In some embodiments, which can be combined with other embodiments described herein, the electron detector 140 includes an Everhard-Thornley detector. An energy filter 142 for the signal electrons 113 may be arranged in front of the electron detector 140, particularly in front of the Everhard-Thornley detector, as schematically depicted in FIG. 1. The energy filter may include a grid electrode configured to be set on a predetermined potential. The energy filter 142 may allow the suppression of low-energy signal electrons. The energy filter 142 may suppress signal electrons that are irrelevant for the voltage contrast measurements to be conducted. In some implementations, the energy filter 142 may suppress signal electrons emitted from uncharged surface areas and may only let through signal electrons emitted from a charged surface contact point. Accordingly, the signal current detected by the electron detector may depend on the energy of the signal electrons which indicates if a probed surface contact point is defective or not.

In some embodiments, the apparatus 100 may include a scan controller 123 connected to a scan deflector 122 of the charged particle beam column 120. The scan deflector 122 may be configured to scan the electron beam over a substrate surface. The electron beam may be directed on a portion of the packaging substrate, e.g. with a first beam probe diameter. The portion of the packaging substrate can be an area of the packaging substrate, wherein the electron beam is scanned over the area of the packaging substrate. The electron beam can be raster scanned over the portion of the packaging substrate. For example, one or more scan deflectors 122 can scan the electron-beam over the portion of the packaging substrate. The portion of the packaging substrate may also be a surface contact point. The electron-beam can be vector scanned to one or more surface contact points of the packaging substrate. For example, one or more scan deflectors can be used to vector scan the electron-beam to one or more surface contact points.

For example, the scan controller 123 may be configured to control the scan deflectors such that the electron beam is sequentially directed to pairs of first and second surface contact points for testing respective device-to-device electrical interconnect paths extending between the respective pairs of first and second surface contact points. This allows a quick and reliable test of a plurality of electrical interconnect paths extending through the packaging substrate.

According to some embodiments, which can be combined with other embodiments described herein, the electron beam can be vector scanned to individual positions, for example surface contact points of the packaging substrate, for charging and can be vector scanned to individual positions for detecting signal electrons. Alternatively, the electron beam can be vector scanned to individual positions, for example surface contact points of the packaging substrate, for charging and can be raster scanned over an area of the packaging substrate for detecting signal electrons. According to some embodiments, which can be combined with other embodiments described herein, an electron-beam of the charged particle beam column can be scanned to one or more positions on the packaging substrate for charging and for detecting of signal electrons.

As it is schematically depicted in FIG. 1, the electron source 121 is connected to a power supply 130. The power supply can provide a high-voltage to the electron source for emitting the electron beam, i.e. the primary electron beam, from the electron source. According to some embodiments, which can be combined with other embodiments described herein, the voltage provided by the power supply 130 can be varied to change the energy of the electron beam and, thus, the landing energy of the electron beam on the packaging substrate. According to some embodiments, which can be combined other embodiments described herein, one or more power supplies can be connected to various components of the electron beam column. For example, power supplies can be connected to the electron source (as shown in FIG. 1), to an extractor of the electron source, to an anode of the electron source, to a deceleration electrode configured to decelerate the electrons before impingement on the packaging substrate, and/or to the stage 105. The landing energy of the electron beam on the packaging substrate is determined by the potential difference between the potential of the emitter tip of the electron source and the potential of the packaging substrate or the potential of the stage 105, respectively. Accordingly, one or more power supplies to vary the landing energy of the electron beam can be provided.

As shown in FIG. 1, the apparatus 100 can include one or more UV sources 170, e.g. a UV source generating UV radiation. The one or more UV sources 170 can be positioned at the vacuum chamber 110. For example, the one or more UV sources 170 can be positioned to allow for uniform illumination of the test area of the charged particle beam column 120. The illumination areas 172 of UV source are depicted in FIG. 1.

According to some embodiments, which can be combined with other embodiments described herein, to control the charge of all test points (surface contact points) on an AP or PLP substrate a vacuum ultraviolet (VUV) light source can be provided. The UV source can be integrated in the charged particle beam column and/or the vacuum chamber 110. The field of view (FOV) of the charged particle beam column, i.e. the SEM FOV, can be irradiated before an electron beam test sequence, particularly directly before an electron-beam test sequence, during an electron-beam test sequence, or after an electron-beam test sequence. Particularly, areas of the packaging substrate such as the FOV can be irradiated without any mechanical substrate motion, for example, by the stage CV.

The apparatus 100 includes a shutter 175. The shutter 175 can be a mechanical shutter. The shutter is configured to turn on or turn off the UV radiation of the illumination areas 172. According to some embodiments, which can be combined with other embodiments described herein, the UV radiation can be turned on/off quickly or can be pulsed. For example, a UV radiation pulse can be 500 ms or shorter, such as 100 ms or shorter. Particularly, a UV radiation pulse can be 10 ms or shorter. The UV radiation pulse or pulses can be provided by pulsing of the UV source or by a mechanical shutter. According to some embodiments, which can be combined with other embodiments described herein, a method may include moving a shutter to provide pulses of UV radiation while illuminating the packaging substrate with UV radiation.

According to some embodiments, which can be combined with other embodiments described herein, the wavelength of the UV radiation can be 200 nm or shorter, particularly 170 nm or shorter. Additionally or alternatively, a gas discharge tube can be utilized to generate the radiation. For example, a Xenon lamp, a Mercury lamp, a deuterium lamp, or the like may be used. Gas discharge lamps may beneficially be operated in a continuous operation mode. According to some embodiments, which can be combined with other embodiments described herein, the shutter configured to provide UV radiation pulses can be beneficial. A UV source 170 and a shutter may be included in or may form a UV source assembly.

According to some embodiments, which can be combined with other embodiments described herein, the UV source 170, such as VUV source, can be replaceable from outside the column or outside the vacuum chamber. As the lifetime of a UV source is limited, maintenance cycles are improved with the one or more UV sources being replaceable from outside the vacuum atmosphere. For example, UV light might be directed into the charged particle beam column and/or the vacuum chamber through magnesium windows.

According to an embodiment, an apparatus for contactless testing of a packaging substrate is provided. The packaging substrate is a panel level packaging substrate or an advanced packaging substrate. The apparatus includes a vacuum chamber 110 and a stage 105 within the vacuum chamber, wherein the stage is configured to support the packaging substrate being a panel level packaging substrate or an advanced packaging substrate. The apparatus further includes an electron beam column configured to generate an electron beam, wherein the electron beam column includes an objective lens configured to focus the electron beam on the packaging substrate, a scanner configured to scan the electron beam to different positions on the packaging substrate, and an electron detector for detecting signal electrons emitted upon impingement of the electron beam on the packaging substrate. The electron-beam column may further include one or more power supplies to vary the landing energy of the electron beam column. The apparatus further includes a UV source assembly configured to illuminate the packaging substrate in the vacuum chamber with pulses of UV radiation and an analysis unit for determining, based on the signal electrons, if the first device-to-device electrical interconnect path is defective.

According to some embodiments, which can be combined with other embodiments described herein, the UV source assembly includes a UV source generating the UV radiation and a movable shutter to generate one or more pulses of UV radiation.

FIG. 1 exemplarily illustrates the stage 105 being connected to ground. The stage may be connected directly to ground, may be connected to ground via a DC power supply as 106 exemplarily shown in FIG. 1, or may be connected to ground via an AC power supply. According to some embodiments, which can be combined with other embodiments described herein, the stage can include a conductive stage surface connected directly or indirectly to ground for providing a reference potential.

When placing the packaging substrate on the stage 105, the packaging substrate has a defined charge provided thereon. Irrespective thereof, the stage can be conductive. Accordingly, the stage can be provided at a defined potential. For example, the defined potential may be ground potential or may be a potential negative or positive with respect to ground. For example, a DC power supply can be provided between ground and a conductive stage. Alternatively, an AC power supply can be provided between ground and a conductive stage, wherein an alternating defined potential can be provided. According to some embodiments, which can be combined with other embodiments described herein, the surface of the stage 105 is provided with a non-conductive material. For example, a layer of dielectric material can be provided as the surface of the stage. Having a non-conductive stage surface allows charge is applied to the packaging substrate to maintain on the packaging substrate in order to be detected during the testing operation or a defect review operation.

The defined potential of the stage, particularly a conductive stage, provides electrical field lines, particularly at non-conductive portions of the stage surface and the packaging substrate. The defined potential can be utilized to influence the electron-beam of the electron-beam column.

According to yet further embodiments, which can be combined with other embodiments described herein, a capacitive coupling of the packaging substrate to the stage 105 can provide the packaging substrate on a defined potential. For example, a capacitive coupling to ground can be provided by the conductive stage 105 to ground. Additionally or alternatively a predetermined set of structures on the packaging substrate may be connected to ground. However, predetermined set of structures may not be charged due to the grounding and may serve as a reference potential.

According to some embodiments, which can be combined with other embodiments described herein, the one or more illumination areas 172 provided by the one or more UV source assemblies can be uniform or can have a defined deviation from uniformity. The uniformity or the defined deviation from uniformity is considered over the surface of the packaging substrate, i.e. laterally extending in two dimensions in FIG. 1. Accordingly, a uniform photo effect can be provided across the packaging substrate surface.

A define deviation from uniformity can be provided by generating a first illumination area for a first portion of the packaging substrate and generating a second illumination area for a second portion of the packaging substrate. The illumination can be switched on in one of the illumination areas and can be switched off in the other of the illumination areas. For example, the pulse length of the UV radiation can be varied in different illumination areas. Additionally or alternatively, the intensity of the UV radiation can be varied in different illumination areas. Accordingly, particularly for test sequences providing local charges on the packaging substrate, i.e. charges being provided only to specific areas of the packaging substrate, such charges may be locally removed to improve the overall uniformity of the charge distribution on the packaging substrate.

Embodiments of the present disclosure allow for alternating and/or pulsed UV, for example, fast alternating VUV radiation such as with a wavelength of 170 nm or shorter in addition to electron beam scan. The effect to control the substrate charge with VUV radiation is the photo effect. Ions generated by the VUV light with residual gas may contribute to the charge control having UV radiation. Discharging with VUV can be fast. Accordingly, UV pulses for discharging of one or more portions of the packaging substrate can be implemented in a test sequence, for example, at one or more different times in a test sequence.

FIG. 1 shows a controller 180. According to some embodiments, which can be combined with other embodiments described herein, the controller can be connected to one or more of the components of the apparatus 100 for contactless testing of a packaging substrate. As exemplarily shown in FIG. 1, the controller can be connected to the power supply 130, the scan controller 123, the analysis unit 141, the UV source assembly (source and/or shutter), and the stage 150. The controller may also be connected to the electron detector 140.

The controller 180 comprises a central processing unit (CPU), a memory and, for example, support circuits. To facilitate control of the apparatus for testing packaging substrates, the CPU may be one of any form of general purpose computer processor that can be used in an industrial setting for controlling various chambers and sub-processors. The memory is coupled to the CPU. The memory, or a computer readable medium, may be one or more readily available memory devices such as random access memory, read only memory, hard disk, or any other form of digital storage either local or remote. The support circuits may be coupled to the CPU for supporting the processor in a conventional manner. These circuits include cache, power supplies, clock circuits, input/output circuitry and related subsystems, and the like. Inspecting process instructions are generally stored in the memory as a software routine typically known as a recipe. The software routine may also be stored and/or executed by a second CPU (not shown) that is remotely located from the hardware being controlled by the CPU. The software routine, when executed by CPU, transforms the general purpose computer into a specific purpose computer (controller) that controls the apparatus operation such as that for controlling the charge control, e.g. with UV radiation, landing energy, the stage positioning and/or charged particle beam scanning during the testing operation. Although the method and/or process of the present disclosure is discussed as being implemented as a software routine, some of the method steps that are disclosed therein may be performed in hardware as well as by the software controller. As such, embodiments of the invention may be implemented in software as executed upon a computer system, and hardware as an application specific integrated circuit or other type of hardware implementation, or a combination of software and hardware.

The controller may execute or perform a method of testing a packaging substrate with an electron beam column. The method according to some embodiments includes directing an electron-beam of the at least one electron beam column with the first landing energy on at least a first portion of the packaging substrate and directing the electron beam of the at least one electron beam column with the second landing energy different than the first landing energy on the packaging substrate. The method further includes detecting signal electrons emitted upon impingement of the electron beam for testing at least one first device-to-device electrical interconnect path of the packaging substrate.

According to an embodiment, and apparatus for testing of packaging substrates with any of the methods described herein is provided. The apparatus may include the controller 180. The controller includes a processor and a memory storing instructions that, when executed by the processor, cause the apparatus to perform a method according embodiments of the present disclosure.

Figure 2A:
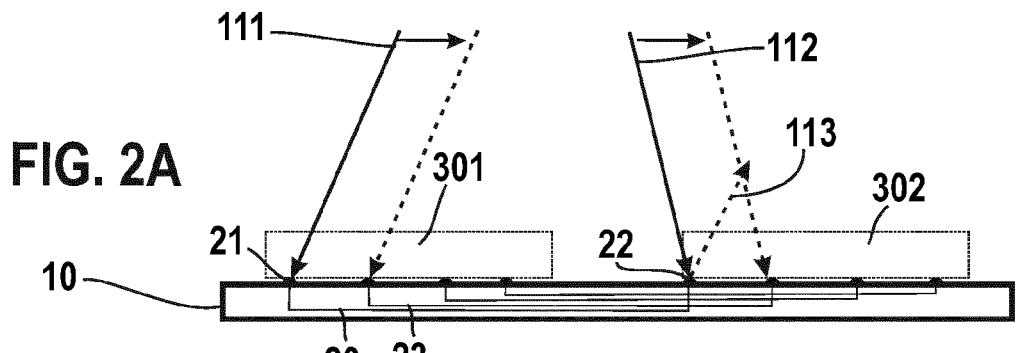
FIGS. 2A and 2B show enlarged sectional views of packaging substrates during any of the testing methods described herein.
Figure 2B:
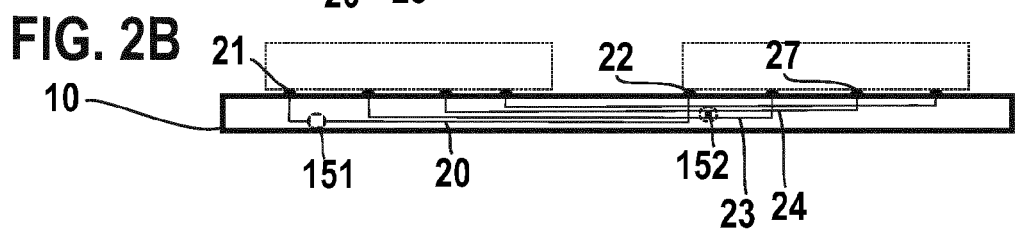

FIGS. 2A and 2B show enlarged sectional views of packaging substrates during a testing method described herein. The packaging substrate 10 may be an AP substrate or a PLP-substrate for the manufacture of a multi-die integrated package and includes a first die connection interface for attaching a first die 301 and a second die connection interface for attaching a second die 302. A plurality of device-to-device electrical interconnect paths (four of which are exemplarily shown in FIG. 2A and FIG. 2B) extend between a respective first surface contact point of the first die connection interface and a respective second surface contact point of the second die interconnection interface. The surface contact points may be formed as or include solder bumps that have a three-dimensional geometry, e.g., an essentially semi-spherical shape.

In FIG. 2A, a first device-to-device electrical interconnect path 20 extending between a first surface contact point 21 and a second surface contact point 22 is tested by directing a charging electron beam 111 on the first surface contact point 21 and directing the electron beam on the second surface contact point 22. Since the first surface contact point 21 is electrically connected to the second surface contact point 22 by the first device-to-device electrical interconnect path 20, the second surface contact point 22 should be at the same electrical potential as the first surface contact point 21 after charging of the first surface contact point 21. Signal electrons 113 emitted from the second surface contact point 22 are detected that carry an information about the electrical potential of the second surface contact point 22 which should be equal to the electrical potential of the first surface contact point 21. If an electrical potential of the second surface contact point 22 different from the electrical potential of the first surface contact point 21 is determined, a defect is detected. The detected voltage contrast can be used for characterizing the defect. Further, the detected voltage contrasts of subsequent measurements of neighboring electrical interconnect paths can be compared, in order to find out about shorts or leakages between different electrical interconnect path.

After the test of the first device-to-device electrical interconnect path 20, the electron beam 111 can be directed on two surface contact points of a second device-to-device electrical interconnect path 23, e.g. by scanning (vector scanning) the electron beams with respective scan deflectors to other positions and/or by moving the stage on which the packaging substrate is supported. A plurality of device-to-device electrical interconnect paths can be subsequently tested with the charging electron beam and the probing electron beam. Accordingly, a plurality of test points can be tested sequentially and/or in parallel.

In FIG. 2B, an open 151 exists in the first device-to-device electrical interconnect path 20. The open 151 is determined because the second surface contact point 22 is not charged after or during the charging of the first surface contact point 21 by the charging electron beam 111.

In FIG. 2B, a short 152 exists between the second device-to-device electrical interconnect path 23 and a third device-to-device electrical interconnect path 24. The short can be determined because the third device-to-device electrical interconnect path 24 is charged together with the second device-to-device electrical interconnect path 23, which can be detected by the probing electron beam that is directed on the further surface contact point 27 of the third device-to-device electrical interconnect path 24 after or during the charging of the second device-to-device electrical interconnect path 23.

For an evaluation and defect classification, the signals of measurements of neighboring interconnect paths and/or previously collected data can be compared, such that opens, shorts, and leakages in the packaging substrate can be identified.

Figure 3:
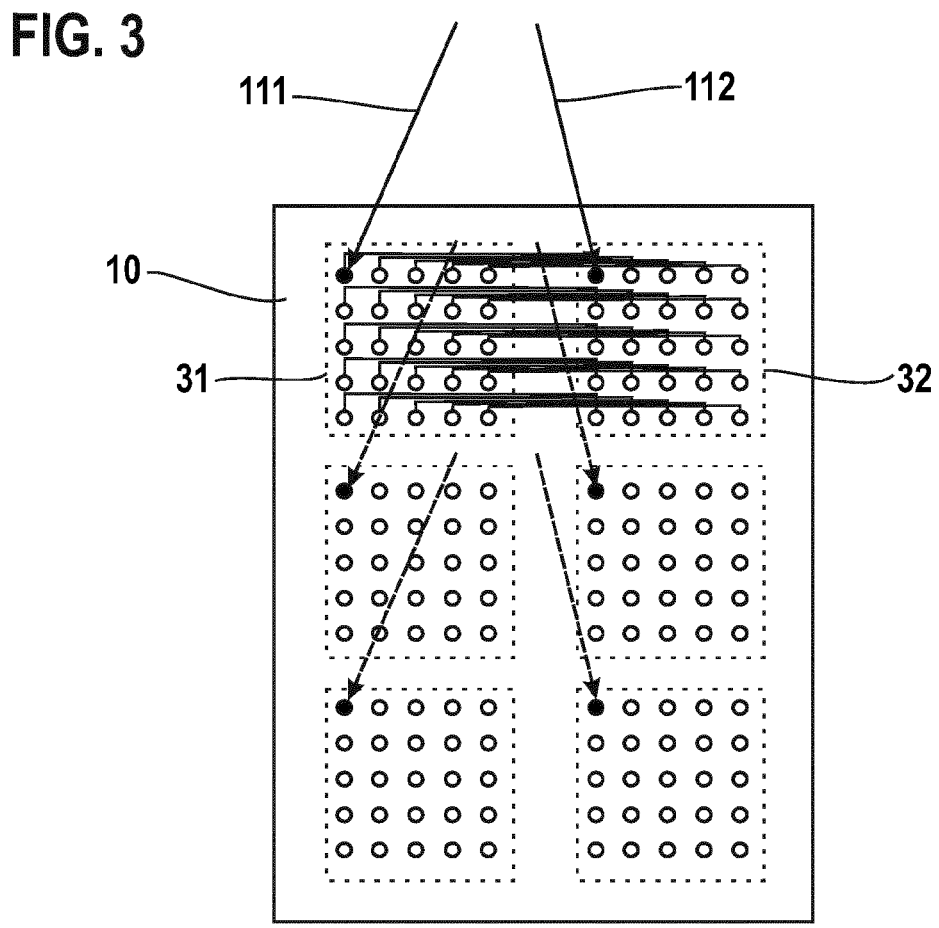
FIG. 3 shows an enlarged top view of a packaging substrate during any of the testing methods described herein.

FIG. 3 is a schematic top view of a packaging substrate 10 as described herein under test. The packaging substrate has a top surface with a plurality of surface contact points arranged in a 2-dimensional pattern. The packaging substrate 10 includes a first die connection interface 31 for attaching a first die, particularly by flip-chip mounting, a second die connection interface 32 for attaching a second die, particularly by flip-chip mounting, and optional further die connection interfaces that may be arranged pairwise next to each other. The first die connection interface 31 may include a plurality of first surface contact points, e.g., formed as solder bumps, and the second die connection interface 32 may include a plurality of second surface contact points, e.g., formed as solder bumps.

In some embodiments, each first surface contact point of the first die connection interface 31 is connected to one respective second surface contact point of the second die connection interface 32 by a device-to-device electrical interconnect path. For the sake of clarity, only the device-to-device electrical interconnect paths connecting the first and second die connection interfaces are depicted. According to some embodiments, which can be combined with other embodiments described herein, the first surface contact point may be connected to one second surface contact point. Alternatively, the first surface contact point may be connected to two or more second surface contact points. The two or more second surface contact points can be probed with the electron beam, for example, after charge has been applied to the first surface contact point.

According to the testing method described herein, the charging electron beam 111 is directed, particularly focused, on a first surface contact point of the first die connection interface 31, and the charging electron beam 111 is directed, particularly focused, on the associated second surface contact point of the second die connection interface 32. Signal electrons emitted from the second surface contact point are detected for testing whether an "open"-defect exists in the electrical interconnect path that connects the first and second surface contact points. Thereafter, the other surface contact points of the first and second die connection interfaces may be tested, particularly pairwise.

Alternatively or additionally, it can be tested in parallel or subsequently, whether the charging of one device-to-device electrical interconnect path leads to the charging of a surface contact point of another device-to-device electrical interconnect path, such that a "short"-defect can be determined. For example, the electron beam can be raster scanned over a portion of the packaging substrate to generate an image of the portion of the packaging substrate. The image can be evaluated, for example, by pattern recognition.

FIGS. 4A to 4D show enlarged sectional views of packaging substrates that can be tested according to the methods described herein.

Figure 4A:
FIGS. 4A-4D show enlarged sectional views of packaging substrates that can be tested according to the methods described herein.
Figure 4B:
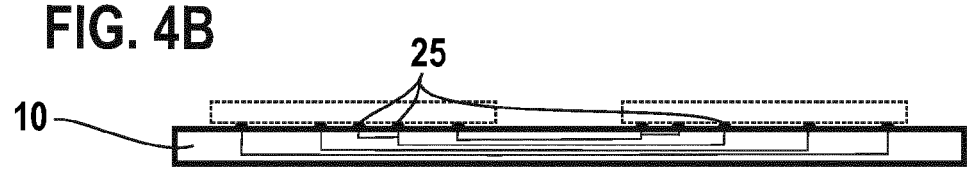

The packaging substrate 10 depicted in FIG. 4A has surface contact points on both main surfaces of the packaging substrate. For example, a first plurality of device-to-device electrical interconnect paths may extend between first and second surface contact points exposed on an upper substrate surface, and a second plurality of device-to-device electrical interconnect paths may extend between first and second surface contact points exposed on a lower substrate surface The packaging substrate 10 depicted in FIG. 4B has at least one device-to-device electrical interconnect path that extends between at least three surface contact points 25, i.e. a first surface contact point, a second surface contact point, and at least a third surface contact point.

Figure 4C:
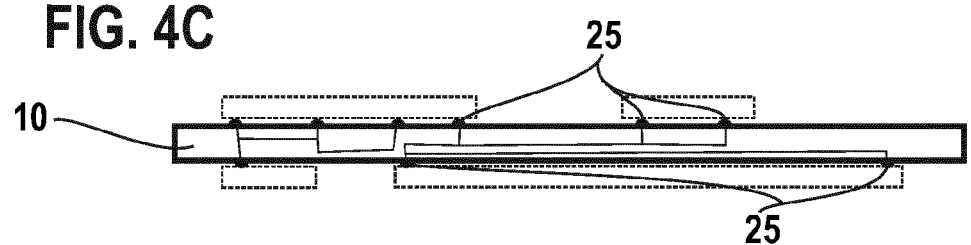

The packaging substrate 10 depicted in FIG. 4C has at least one device-to-device electrical interconnect path that extends between at least three surface contact points 25 that are exposed on different main surfaces of the substrate in a complex connection network. Such a device-to-device electrical interconnect path may be configured for connecting three or more dies with each other through the packaging substrate.

Figure 4D:
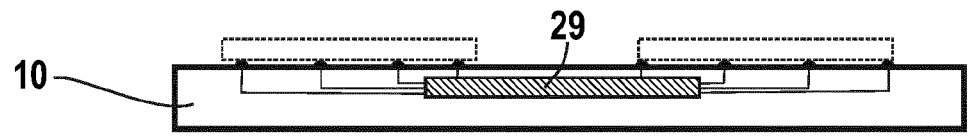

The packaging substrate 10 depicted in FIG. 4D has at least one interconnect bridge 29 embedded in the packaging substrate 10. At least one device-to-device electrical interconnect path extends through the at least one interconnect bridge 29. In particular, a plurality of device-to-device electrical interconnect paths extending between a first die connection interface and a second die connection interface of the packaging substrate extend through the interconnect bridge. The interconnect bridge may be embedded in the packaging substrate during the manufacture of the packaging substrate. The interconnect bridge may be a bridge chip embedded in the packaging substrate for increasing the connection speed between multiple dies.

According to some embodiments, which can be combined with other embodiments described herein, test methods and/or apparatuses according to the present disclosure may be utilized during and/or after manufacturing of a packaging substrate. For example, a test may be applied on a packaging substrate that does not yet include all layers or structures. For example, a test may be conducted after a redistribution layer (RDL) has been manufactured and/or after a via layer has been manufactured. An RDL test and/or a via test can be provided. Yet further, a test may be provided on the finished packaging substrate.

A test may be provided by charging (writing on) one or more portions, e.g. surface contact points, and by detecting the charge by means of signal electrons (reading a charge) on the packaging substrate. The number of electrons emitted from the surface of the packaging substrate per irradiated electron, i.e. the total electron yield is energy dependent. For a total electron yield of 1, the same number of electrons reach the surface of the packaging substrate as compared to the number of signal electrons being emitted from or scattered at the surface of the packaging substrate. There are two neutral energy values, a first neutral energy value $E_{N1}$ and a second neutral energy value $E_{N2}$, for which the total electron yield equals 1, i.e. there is no charging. According to some embodiments, which can be combined with other embodiments described herein, the surface of the packaging substrate can be read, i.e. signal electrons can be detected, with an electron beam having one of the neutral energy values.

According to some embodiments, which can be combined with other embodiments described herein, directing an electron-beam with the first landing energy on a portion of a packaging substrate can be a charging operation. The charging operation "writes" a charge to an electrical interconnect path or a network of electrical interconnect paths. Further, directing an electron-beam with a second landing energy on a portion of the packaging substrate can be an operation for detecting signal electrons. The electron beam at the second landing energy may "read" a charge of an electrical interconnect path or a network of electrical interconnect paths.

According to some embodiments, which can be combined with other embodiments described herein, charging of portions of the packaging substrate is reduced or avoided during detection of signal electrons, i.e. reading of a charge. Particularly, influencing of a charge of electrical interconnect path or network of electrical interconnect paths is avoided or kept to a minimum while detecting signal electrons, for example, detecting the charge previously provided.

For example, a network of electrical interconnect paths may include 5 surface contact points (or any number larger than 2). A charge can be applied, i.e. "written", to a first surface contact point. The charge applied to the network of electrical interconnect paths can be "read" at a second surface contact point. It is beneficial not to change the charge of the network of electrical interconnect paths having the 5 surface contact points while "reading", the charge on the second to fifth surface contact point. Accordingly, charge generation can be reduced or avoided during detecting signal electrons by utilizing a neutral energy value for the landing energy.

The neutral energy values are material dependent. The material of the packaging substrate or a material of the surface of the packaging substrate is known and the landing energies can be adapted to the packaging substrate material for methods of testing the packaging substrate. The first neutral energy value can be a few hundred eV. The second neutral energy value can be between 1.5 keV and 2.5 keV for typical packaging substrates or typical surface contact points on a packaging substrate. According to some embodiments, which can be combined with other embodiments described herein, the landing energy for test methods can be chosen to be above the second neutral energy value for charging, to be between the first neutral energy value and the second neutral energy value for charging, or to be below the first neutral energy value. The landing energy can be adapted depending on the test strategy, the material of the packaging substrate, and/or the material of the surface contact points.

For landing energies below the first neutral energy value, negative charging occurs, i.e. the total electron yield is smaller than 1. For landing energies between the first neutral energy value and the second neutral energy value, positive charging occurs, i.e. the total electron yield is larger than 1. The total electron yield being larger than 1 relates to the fact that more electrons leave the surface as compared to the number of electrons impinging on the surface. Thus, the packaging substrate or structures charge positively. For landing energies above the second neutral energy value, negative charging occurs, i.e. the total electron yield is smaller than 1. The total electron yield being smaller than 1 relates to the fact that less electrons leave the surface as compared to the number of electrons impinging on the surface. The packaging substrates or structures charge negatively.

According to embodiments of the present disclosure, test structures, for example, regions of a packaging substrate and/or surface contact points can be charged positive or negative by the electron beam impact. Depending on the primary energy level, i.e. the landing energy, in relation to the secondary electron yield, the total electron yield can be controlled. The test point potential can be determined. A voltage contrast principle can be utilized for defect detection. According to some embodiments, which can be combined with other embodiments described herein, the landing energy can be changed to be higher or lower than the second neutral energy value. The landing energy of the electron beam is set to a predetermined landing energy and positioned on a portion of the packaging substrate, for example, the surface contact point or test point on the packaging substrate. The electron-beam remains on the portion of the packaging substrate for a defined time to charge the portion of the packaging substrate positive or negative with respect to the environment of the portion of the packaging substrate. For example, the environment of a surface contact point under test can be one or more neighboring surface contact points.

Figure 5:
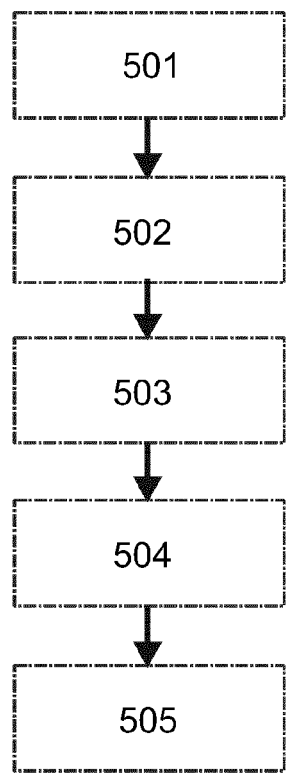
FIGS. 5 and 6 show flowcharts of methods of testing a packaging substrate according to embodiments described herein.

According to embodiments of the present disclosure, UV radiation is utilized to discharge the positive charge or the negative charge, which is provided as described above. According to an embodiment, a method for testing a packaging substrate is provided. The packaging substrate is a panel level packaging substrate or an advanced packaging substrate. As illustrated in FIG. 5, the method is conducted with an electron beam column and includes (see operation 501) placing the packaging substrate on a stage in a vacuum chamber. At operation 502, at least one electron beam of the at least one electron beam column is directed on at least a first portion of the packaging substrate and at operation 503 at least one electron beam of the at least one electron beam column is directed on at least a second portion of the packaging substrate. At operation 504, signal electrons emitted upon impingement of the at least one electron beam are detected for testing a first device-to-device electrical interconnect path of the packaging substrate. At least a third portion of the packaging substrate with UV radiation is illuminated at operation 505. For example, the at least third portion can include or can be the same as the at least first portion and/or can include or can be the same as the at least second portion. If charge is applied to the first portion, the third portion to be discharged is beneficially the same as the first portion. If charge is applied to the first portion and to the second portion the third portion to be discharged is beneficially the same as the first portion and the second portion.

According to some embodiments, which can be combined with other embodiments described herein, the at least one electron beam can be directed on the at least first portion with a first landing energy and on the at least second portion with a second landing energy different than the first charging landing energy. For example, the signal electrons can be detected upon impingement of the at least one electron beam with the second landing energy for reading of a charge on the packaging substrate. For example, the second landing energy can be at or close to or neutral energy value. For example, the reading landing energy deviates by less than +−10% from a neutral energy value, the neutral energy value corresponding to a landing energy with a total electron yield of 1.

According to some embodiments, which can be combined with other embodiments described herein, the illuminating with UV radiation is provided after the detecting signal electrons. Accordingly, during a test sequence or a portion of a test sequence, a charge can be applied, the signal electrons can be detected, for example, for reading of a charge being previously applied. Thereafter, the charge is removed by illuminating with UV radiation. Accordingly, another test sequence may subsequently start, wherein the charge of a previous test sequence or portion of a test sequence has been removed. As described above, according to some embodiments, which can be combined with other embodiments described herein, a method may include a plurality of test sequences, wherein each test sequence including in this order (a) directing at least one electron beam of the at least one electron beam column on the packaging substrate with a writing landing energy; (b) directing the at least one electron beam of the at least one electron beam column on the packaging substrate with a reading landing energy; (c) detecting signal electrons emitted upon impingement of the at least one electron beam having the reading energy for testing a first device-to-device electrical interconnect path of the packaging substrate; and (d) illuminating a portion of the packaging substrate with UV radiation.

Yet further, embodiments, which can be combined with other embodiments described herein may include illuminating at least a fourth portion of the packaging substrate with UV radiation, wherein illuminating at the least the fourth portion is provided after placing the packaging substrate on the stage and before directing an electron beam on the packaging substrate. Accordingly, excessive charge can be neutralized. The packaging substrate can be brought in a defined charge condition.

Figure 6:
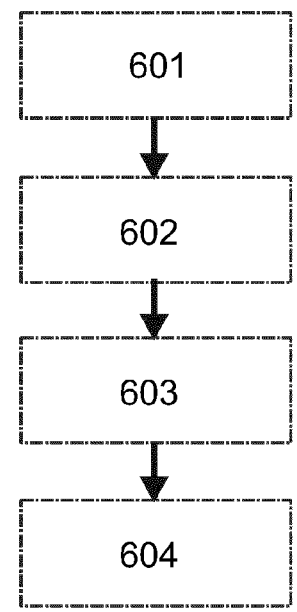

Embodiments of the present disclosure can include a method for testing a packaging substrate as illustrated by the flowchart shown in FIG. 6. At operation 601, and advanced packaging substrate or panel level packaging substrate can be loaded in a test chamber, for example, in the vacuum chamber 110 shown in FIG. 1. At operation 602, the packaging substrate is moved below the electron beam column. At operation 603, the substrate is irradiated with VUV radiation to neutralize excessive charge and/or to bring the substrate to a defined charge condition. Further, a reference potential, e.g. a reference to ground, can be provided via the conductive stage as described above. At operation 604, for example, after a VUV pulse having a length of 100 ms or shorter, the VUV is turned off and an electron beam test or test sequence may start. For example, the dose can be defined by the pulse time. The electron-beam test or electron-beam test sequence may include charging of test points and reading of test points, i.e. surface contact points on the packaging substrate. According to some embodiments, which can be combined with other embodiments described herein, an intermediate VUV discharge operation can be provided during an e-beam test or an e-beam test sequence.

Figure 7A:
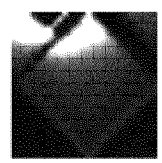
FIGS. 7A and 7B show exemplary images illustrating the improvement of embodiments of the present disclosure.
Figure 7B:
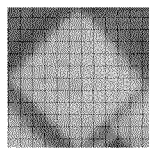

As shown in FIGS. 7A and 7B, generating a defined charge condition is beneficial for improved test results. FIG. 7A shows an image of a portion of a packaging substrate, for example, a test pad, before UV radiation. Without preconditioning by VUV the image shows reduced uniformity and higher noise. Different e-beam positioning on the test pad would result in different signal levels. A correlation between test pad potential and voltage contrast may be different for different electron beam positions on the test pad. As shown in FIG. 7B, with preconditioning by VUV the image shows improved uniformity and lower signal noise. Different e-beam positioning on the test pad would result in same signal levels. A good correlation between test pad potential and the voltage contrast can be provided. Accordingly, by preconditioning by UV radiation an improved charged uniformity and an improved signal to noise ratio can be provided. The defect detectability can be improved and more precise parametric measurements, i.e. capacity, can be conducted.

Embodiments of the present disclosure provide for electron beam testing, and particularly including electron-beam writing and electron beam reading of charges on the packaging substrate. Illumination with UV radiation is utilized to discharge one or more portions of the packaging substrate, particularly to generate a defined measurement condition and/or starting condition. An improved signal to noise ratio can be provided due to the defined conditions for various or all test points, i.e. surface contact points. An integral and uniform charge control method of the full test area can be provided. The charge control is fast, particularly as the photo effect is faster than other effects. Further, the discharging can be provided without stage motion. The speed of the discharging allows for different testing modes with fast alternating VUV irradiation and e-beam scan. A contact free charge control can be provided.

According to some embodiments, which can be combined with other embodiments described herein, the at least one electron beam can be focussed while directing the electron beam on the at least first portion of the packaging substrate and on the at least second portion of the packaging substrate. Additionally or alternatively, the electron beam can be scanned to one or more positions on the packaging substrate for charging and for detecting the signal electrons.

Embodiments of the present disclosure provide one or more of the following advantages. A contact free electrical test of packaging substrates as disclosed herein can be provided, wherein electrical charge can be controlled for electrical defect detection. In light of the flexibility of the electron-beam, increased testing speed can be provided. An improved signal to noise ratio can be provided due to the defined conditions for various or all test points, i.e. surface contact points. An integral and uniform charge control method of the full test area can be provided. A test including 100% of the electrical interconnection path is possible during volume production. Further, the flexibility of the electron-beam allows for testing and flexible setup for different AP/PLP substrate layouts. The test methods and apparatuses disclosed herein further allow for being scalable to smaller dimensions, particularly if technical development moves towards smaller structure sizes. The testing of the packaging substrates is damage free.

The following embodiments also form part of the present disclosure:

Embodiment 1. A method for testing a packaging substrate (10), the packaging substrate being a panel level packaging substrate or an advanced packaging substrate, with at least one electron beam column, the method comprising:
  placing the packaging substrate (10) on a stage (105) in a vacuum chamber (101);
  directing at least one electron beam of the at least one electron beam column on at least a first portion of the packaging substrate;
  directing the at least one electron beam of the at least one electron beam column on at least a second portion of the packaging substrate;
  detecting signal electrons emitted upon impingement of the at least one electron beam for testing a first device-to-device electrical interconnect path of the packaging substrate; and
  illuminating at least a third portion of the packaging substrate with UV radiation.

Embodiment 2. The method of Embodiment 1, wherein the at least one electron beam is directed on at least the first portion with a first landing energy and on at least the second portion with a second landing energy different than the first landing energy.

Embodiment 3. The method of Embodiment 2, wherein the signal electrons are detected upon impingement of the at least one electron beam with the second landing energy for reading of a charge on the packaging substrate.

Embodiment 4. The method of any of Embodiments 1 to 3, wherein the illuminating with UV radiation is provided after the detecting signal electrons.

Embodiment 5. The method of Embodiment 4, further comprising:
  providing a plurality of test sequences, each test sequence including in this order:
    (a) directing the at least one electron beam of the at least one electron beam column on the packaging substrate with a writing landing energy;
    (b) directing the at least one electron beam of the at least one electron beam column on the packaging substrate with a reading landing energy;
    (c) detecting signal electrons emitted upon impingement of the at least one electron beam having the reading landing energy for testing a device-to-device electrical interconnect path of the packaging substrate; and
    (d) illuminating a portion of the packaging substrate with UV radiation.

Embodiment 6. The method of Embodiment 5, wherein the reading landing energy deviates by less than +−10% from a neutral energy value, the neutral energy value corresponding to a landing energy with a total electron yield of 1.

Embodiment 7. The method of any of Embodiments 1 to 6, further comprising:
  illuminating at least a fourth portion of the packaging substrate with UV radiation, wherein illuminating at least the fourth portion is provided after placing the packaging substrate on the stage and before directing an electron beam on the packaging substrate.

Embodiment 8. The method of any of Embodiments 1 to 7, wherein the at least one electron beam is focused while directing the electron beam on at least the first portion of the packaging substrate and on at least the second portion of the packaging substrate.

Embodiment 9. The method of any of Embodiments 1 to 8, further comprising:
  scanning the electron beam to one or more positions on the packaging substrate for charging and for detecting the signal electrons.

Embodiment 10. The method of any of Embodiments 1 to 9, further comprising:
  moving a shutter to provide one or more pulses of UV radiation while illuminating the packaging substrate with UV radiation.

Embodiment 11. The method of any of Embodiments 1 to 10, wherein the UV radiation is VUV radiation, particularly with a wavelength of 170 nm or shorter.

Embodiment 12. The method of any of Embodiments 1 to 11, wherein the packaging substrate comprises a plurality of device-to-device electrical interconnect paths extending between respective first surface contact points and second surface contact points, the method comprising:
  testing the plurality of device-to-device electrical interconnect paths sequentially and/or in parallel.

Embodiment 13. The method of Embodiment 12, wherein the first surface contact points and the second surface contact points have a diameter of 25 µm or less, particularly 10 µm or less.

Embodiment 14. The method of any of Embodiments 1 to 13, further comprising:
energy filtering the signal electrons.

Embodiment 15. An apparatus for testing a packaging substrate in accordance with the method of any of Embodiments 1 to 14.

Embodiment 16. An apparatus (100) for contactless testing of a packaging substrate (10), comprising:
a vacuum chamber (101);
a stage (105) within the vacuum chamber, the stage being configured to support the packaging substrate being a panel level packaging substrate or an advanced packaging substrate;
a charged particle beam column (120) configured to generate an electron beam, the charged particle beam column comprising:
an objective lens (124) configured to focus the electron beam on the packaging substrate;
a scanner configured to scan the electron beam to different positions on the packaging substrate; and
an electron detector (140) for detecting signal electrons (113) emitted upon impingement of the electron beam on the packaging substrate;
the apparatus further comprising:
a UV source assembly configured to illuminate the packaging substrate in the vacuum chamber with one or more pulses of UV radiation; and
an analysis unit (141) for determining, based on the signal electrons (113), if a first device-to-device electrical interconnect path (20) is defective.

Embodiment 17. The apparatus of Embodiments 16, further the UV source assembly comprising:
a UV source generating UV radiation; and
a movable shutter to generate the one or more pulses of UV radiation.

Embodiment 18. The apparatus of any of Embodiments 16 to 17, wherein the stage comprises:
a conductive stage surface connected directly or indirectly to ground for providing a reference potential.

Embodiment 19. The apparatus of any of Embodiments 16 to 18, wherein the electron detector (140) comprises:
an energy filter (142) for the signal electrons (113).

Embodiment 20. The apparatus of any of Embodiments 16 to 19, further comprising:
a scan controller (123) configured to sequentially direct the electron beam to pairs of first and second surface contact points for testing respective device-to-device electrical interconnect paths extending between the respective pairs of first and second surface contact points.

While the foregoing is directed to some embodiments, other and further embodiments may be devised without departing from the basic scope thereof, and the scope thereof is determined by the claims that follow.

The invention claimed is:

1. A method for testing a packaging substrate (10) for multi-device in-package integration, with at least one electron beam column, the method comprising: placing the packaging substrate (10) on a stage (105) in a vacuum chamber (101); directing at least one electron beam of the at least one electron beam column on at least a first portion of the packaging substrate; directing the at least one electron beam of the at least one electron beam column on at least a second portion of the packaging substrate; detecting signal electrons emitted upon impingement of the at least one electron beam for testing a first device-to-device electrical interconnect path of the packaging substrate; illuminating at least a third portion of the packaging substrate with UV radiation; and providing a reference potential via a conductive stage while illuminating the third portion with UV radiation.

2. The method of claim 1, wherein the at least one electron beam is directed on at least the first portion with a first landing energy and on at least the second portion with a second landing energy different than the first landing energy.

3. The method of claim 2, wherein the signal electrons are detected upon impingement of the at least one electron beam with the second landing energy for reading of a charge on the packaging substrate.

4. The method of claim 1, wherein the illuminating with UV radiation is provided after the detecting signal electrons.

5. The method of claim 4, further comprising:
providing a plurality of test sequences, each test sequence including in this order:
(a) directing the at least one electron beam of the at least one electron beam column on the packaging substrate with a writing landing energy;
(b) directing the at least one electron beam of the at least one electron beam column on the packaging substrate with a reading landing energy;
(c) detecting signal electrons emitted upon impingement of the at least one electron beam having the reading landing energy for testing a device-to-device electrical interconnect path of the packaging substrate; and
(d) illuminating a portion of the packaging substrate with UV radiation.

6. The method of claim 5, wherein the reading landing energy deviates by less than +−10% from a neutral energy value, the neutral energy value corresponding to a landing energy with a total electron yield of 1.

7. The method of claim 1, further comprising:
illuminating at least a fourth portion of the packaging substrate with UV radiation, wherein illuminating at least the fourth portion is provided after placing the packaging substrate on the stage and before directing an electron beam on the packaging substrate.

8. The method of claim 1, wherein the at least one electron beam is focused while directing the electron beam on at least the first portion of the packaging substrate and on at least the second portion of the packaging substrate.

9. The method of claim 1, further comprising:
scanning the electron beam to one or more positions on the packaging substrate for charging and for detecting the signal electrons.

10. The method of claim 1, further comprising:
moving a shutter to provide one or more pulses of UV radiation while illuminating the packaging substrate with UV radiation.

11. The method of claim 1, wherein the UV radiation is VUV radiation.

12. The method of claim 1, wherein the packaging substrate comprises a plurality of device-to-device electrical interconnect paths extending between respective first surface contact points and second surface contact points, the method comprising:
testing the plurality of device-to-device electrical interconnect paths sequentially and/or in parallel.

13. The method of claim 12, wherein the first surface contact points and the second surface contact points have a diameter of 25 µm or less.

14. The method of claim 1, further comprising:
energy filtering the signal electrons.

15. An apparatus for testing a packaging substrate in accordance with the method for testing a packaging substrate (10) for multi-device in-package integration, with at least one electron beam column, the method comprising: placing the packaging substrate (10) on a stage (105) in a vacuum chamber (101); directing at least one electron beam of the at least one electron beam column on at least a first portion of the packaging substrate; directing the at least one electron beam of the at least one electron beam column on at least a second portion of the packaging substrate; detecting signal electrons emitted upon impingement of the at least one electron beam for testing a first device-to-device electrical interconnect path of the packaging substrate; and illuminating at least a third portion of the packaging substrate with UV radiation; and providing a reference potential via a conductive stage while illuminating the third portion with UV radiation.

16. An apparatus (100) for contactless testing of a packaging substrate (10) for multi-device in-package integration, comprising: a vacuum chamber (101); a stage (105) within the vacuum chamber, the stage being configured to support the packaging substrate and having a conductive stage surface connected directly or indirectly to ground for providing a reference potential; a charged particle beam column (120) configured to generate an electron beam, the charged particle beam column comprising: an objective lens (124) configured to focus the electron beam on the packaging substrate; a scanner configured to scan the electron beam to different positions on the packaging substrate; and an electron detector (140) for detecting signal electrons (113) emitted upon impingement of the electron beam on the packaging substrate; the apparatus further comprising: a UV source assembly configured to illuminate the packaging substrate in the vacuum chamber with one or more pulses of UV radiation while the reference potential is provided; and an analysis unit (141) for determining, based on the signal electrons (113), if a first device-to-device electrical interconnect path (20) is defective.

17. The apparatus of claim 16, further the UV source assembly comprising:
a UV source generating UV radiation; and
a movable shutter to generate the one or more pulses of UV radiation.

18. The apparatus of claim 16, wherein the stage comprises:
a conductive stage surface connected directly or indirectly to ground for providing a reference potential.

19. The apparatus of claim 16, wherein the electron detector (140) comprises:
an energy filter (142) for the signal electrons (113).

20. The apparatus of claim 16, further comprising:
a scan controller (123) configured to sequentially direct the electron beam to pairs of first and second surface contact points for testing respective device-to-device electrical interconnect paths extending between the respective pairs of first and second surface contact points.

* * * * *